United States Patent
Bae et al.

(10) Patent No.: US 11,943,994 B2
(45) Date of Patent: Mar. 26, 2024

(54) DISPLAY DEVICE OF REDUCING THE OCCURRENCE OF OPTICAL AFTERIMAGES AND METHOD OF MANUFACTURING THE SAME

(71) Applicant: Samsung Display Co., Ltd., Yongin-Si (KR)

(72) Inventors: Chul Min Bae, Hwaseong-si (KR); Eun Jin Kwak, Hwaseong-si (KR); Jin Suk Lee, Gwangmyeong-si (KR); Jung Yun Jo, Namyangju-si (KR); Ji Hye Han, Seoul (KR); Young In Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 248 days.

(21) Appl. No.: 17/404,004

(22) Filed: Aug. 17, 2021

(65) Prior Publication Data
US 2022/0140262 A1 May 5, 2022

(30) Foreign Application Priority Data
Nov. 3, 2020 (KR) .......................... 10-2020-0145094

(51) Int. Cl.
*H10K 77/10* (2023.01)
*C23C 14/18* (2006.01)
(Continued)

(52) U.S. Cl.
CPC ............ *H10K 77/111* (2023.02); *C23C 14/18* (2013.01); *C23C 16/345* (2013.01);
(Continued)

(58) Field of Classification Search
CPC .... H10K 77/111; H10K 50/844; H10K 59/12; H10K 71/00; H10K 71/80;
(Continued)

(56) References Cited

U.S. PATENT DOCUMENTS 8,906,813 B2 * 12/2014 Won ................... H01L 21/02164
438/788
9,553,280 B2 * 1/2017 Seo ......................... H10K 71/00
(Continued)

FOREIGN PATENT DOCUMENTS

KR 10-2006-0055100 A 5/2006
KR 10-2008-0062528 A 7/2008
(Continued)

OTHER PUBLICATIONS

Schoenholtz, J.E., and D.W. Hess. "Plasma-Enhanced Deposition of Silicon Oxynitride Films." Thin Solid Films, vol. 148, No. 3, 1987, pp. 285-291, https://doi.org/10.1016/0040-6090(87)90322-1. (Year: 1987).*
(Continued)

*Primary Examiner* — J. E. Schoenholtz
(74) *Attorney, Agent, or Firm* — Innovation Counsel LLP

(57) ABSTRACT

A display device and a method of manufacturing the same are provided. The display device, comprises a first base substrate, a first barrier layer disposed on the first base substrate, a second base substrate disposed on the first barrier layer, at least one transistor disposed on the second base substrate, and an organic light emitting diode disposed on the at least one transistor, wherein the first barrier layer includes a silicon oxide, and has an adhesion force of 200 gf/inch or more to the second base substrate.

15 Claims, 10 Drawing Sheets

(51) Int. Cl.
*C23C 16/34* (2006.01)
*C23C 16/40* (2006.01)
*C23C 28/00* (2006.01)
*G09G 3/3233* (2016.01)
*H10K 50/844* (2023.01)
*H10K 59/12* (2023.01)
*H10K 71/00* (2023.01)
*H10K 71/80* (2023.01)

(52) U.S. Cl.
CPC ............ *C23C 16/401* (2013.01); *C23C 28/30* (2013.01); *H10K 50/844* (2023.02); *H10K 59/12* (2023.02); *H10K 71/00* (2023.02); *H10K 71/80* (2023.02); *G09G 3/3233* (2013.01); *G09G 2300/0443* (2013.01); *G09G 2300/0809* (2013.01); *H10K 59/1201* (2023.02)

(58) Field of Classification Search
CPC ........... H10K 59/1201; H10K 50/8445; H10K 50/8426; C23C 14/18; C23C 16/345; C23C 16/401; C23C 28/30; C23C 28/00; G09G 3/3233; G09G 2300/0443; G09G 2300/0809; G09G 2300/0426; G09G 2300/0814; G09G 2300/0819; G09G 2300/0866; G09G 2320/0257; G09G 2320/045; Y02E 10/549; H01L 21/02164; H01L 27/1218; H01L 27/1262
See application file for complete search history.

(56) References Cited

U.S. PATENT DOCUMENTS

| | | | |
|---|---|---|---|
| 2012/0171391 A1* | 7/2012 | Won | C23C 16/511 427/575 |
| 2013/0302999 A1* | 11/2013 | Won | H01L 21/0262 438/787 |
| 2014/0339517 A1* | 11/2014 | Park | H10K 77/111 257/40 |
| 2014/0339527 A1* | 11/2014 | Lee | H10K 59/00 438/34 |
| 2016/0141551 A1* | 5/2016 | Seo | H10K 50/8445 257/40 |
| 2020/0006685 A1* | 1/2020 | Xie | H10K 59/124 |
| 2020/0350165 A1* | 11/2020 | Shan | H01L 29/0684 |
| 2023/0180592 A1* | 6/2023 | Li | H10K 77/111 428/213 |

FOREIGN PATENT DOCUMENTS

| | | |
|---|---|---|
| KR | 10-1106105 B1 | 1/2012 |
| KR | 10-2015-0054305 A | 5/2015 |
| KR | 10-2015-0125151 A | 11/2015 |

OTHER PUBLICATIONS

Teng, L., and W. A. Anderson. "Low-Temperature Pecvd SiO2 on Si and SiC." MRS Proceedings, vol. 483, 1997, https://doi.org/10.1557/proc-483-147. (Year: 1997).*

Barranco, A., et al. "Room Temperature Synthesis of Porous SiO2 Thin Films by Plasma Enhanced Chemical Vapor Deposition." Journal of Vacuum Science Technology A: Vacuum, Surfaces, and Films, vol. 22, No. 4, 2004, pp. 1275-1284, https://doi.org/10.1116/1.1761072. (Year: 2004).*

* cited by examiner

120: 121
130: 131, 133
150: 151
160: 161, 162, 163, 164, 165
170: 171

US 11,943,994 B2

DISPLAY DEVICE OF REDUCING THE OCCURRENCE OF OPTICAL AFTERIMAGES AND METHOD OF MANUFACTURING THE SAME

CROSS-REFERENCE TO RELATED APPLICATION

This application claims priority from Korean Patent Application No. 10-2020-0145094, filed on Nov. 3, 2020, in the Korean Intellectual Property Office, the disclosure of which is incorporated herein by reference in its entirety.

BACKGROUND

1. Field of the Disclosure

The present disclosure generally relates to a display device and a method of manufacturing the same. More particularly, the present disclosure relates to a display device capable of improving the adhesion force of a barrier layer and reducing the occurrence of optical afterimages, and a method of manufacturing the same.

2. Description of the Related Art

With the development of information society, requirements for display devices for displaying images have increased in various forms. Display devices include a liquid crystal display (LCD), a plasma display panel (PDP), an organic light emitting display (OLED), and a micro light emitting diode display.

A display device includes a light emitting diode and a plurality of thin film transistors connected to the light emitting diode. The plurality of thin film transistors may include a thin film transistor including polycrystalline silicon or a thin film transistor including oxide. The thin film transistor including polycrystalline silicon has an advantage of supplying a stable driving current, and the thin film transistor including oxide has an advantage of having a rapid turn-on operation and excellent off-current characteristics.

SUMMARY

Aspects of the present disclosure are to provide a display device capable of improving the adhesion force of a barrier layer and reducing the occurrence of optical afterimages, and a method of manufacturing the same.

According to an embodiment of the disclosure, the display device, comprises a first base substrate, a first barrier layer disposed on the first base substrate and including a silicon oxide, a second base substrate disposed on the first barrier layer, at least one transistor disposed on the second base substrate, and an organic light emitting diode disposed on the at least one transistor, wherein an adhesion force between the first barrier layer and the second base substrate is 200 gf/inch or more.

In an embodiment, the first barrier layer has a dielectric constant of 4 to 6.

In an embodiment, the first barrier layer has a Si—O bonding peak of 1,048 nm or less in Fourier Transform-Infrared Spectroscopy (FT-IR) analysis.

In an embodiment, the first barrier layer has a film stress of −230 MPa or more.

In an embodiment, the first barrier layer has a hydrogen content of 1.20E+21 atom/cm$^3$ or more.

In an embodiment, the first barrier layer has a thickness of 5,000 Å to 7,000 Å.

In an embodiment, the first barrier layer is in contact with an upper surface of the first base substrate and a lower surface of the second base substrate.

In an embodiment, the first base substrate and the second base substrate include polyimide.

In an embodiment, the display device further comprises a second barrier layer disposed on the second base substrate, and a buffer layer disposed on the second barrier layer.

According to an embodiment of the disclosure, the method of manufacturing a display device, the method comprises steps of: forming a first base substrate on a support substrate, forming a first barrier layer disposed on the first base substrate and including silicon oxide on the first base substrate using reactive gas having a ratio of $SiH_4$ gas to $N_2O$ gas of 22 or less, forming a second base substrate disposed on the first barrier layer, forming at least one transistor disposed on the second base substrate, and forming an organic light emitting diode disposed on the at least one transistor.

In an embodiment, the ratio of $SiH_4$ gas to $N_2O$ gas is 19 to 22.

In an embodiment, the first barrier layer is formed using a power of 8,000 W to 10,000 W.

In an embodiment, the first barrier layer is formed at a pressure of 900 mTorr to 1,100 mTorr.

In an embodiment, the first barrier layer is formed at a temperature of 350° C. to 400° C.

In an embodiment, the first barrier layer is formed to have a thickness of 5,000 Å to 7,000 Å.

In an embodiment, the method further comprises steps of: forming a second barrier layer disposed on the second base substrate, and forming a buffer layer disposed on the second barrier layer.

In an embodiment, the method further comprises a step of: after the forming of the organic light emitting diode, forming an encapsulation layer including a first encapsulation inorganic layer, an encapsulation organic layer, and a second encapsulation inorganic layer disposed on the organic light emitting diode.

In an embodiment, the method further comprises a step of: after the forming of the organic light emitting diode, removing the support substrate from the first base substrate.

In an embodiment, the first barrier layer has an adhesion force of 200 gf/inch or more to the second base substrate.

In an embodiment, the first barrier layer has a hydrogen content of 1.20E+21 atom/cm$^3$ or more.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the attached drawings.

Figure 1:
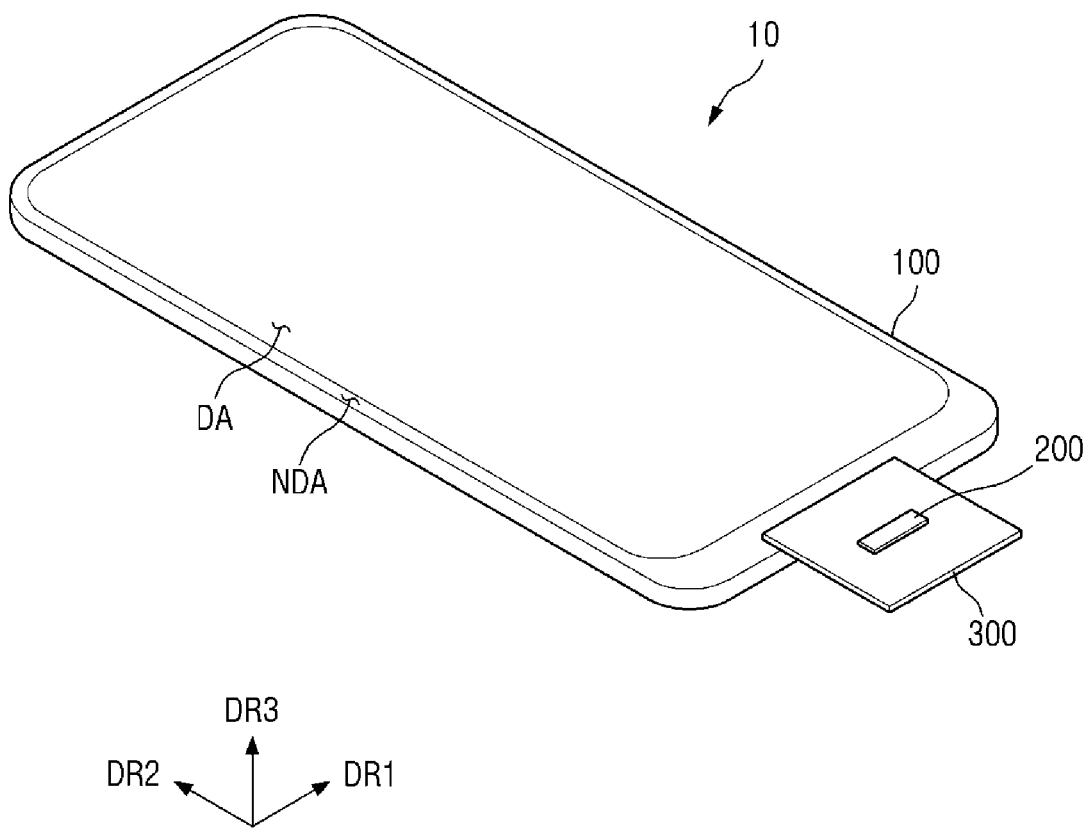
FIG. 1 is a perspective view of a display device according to an embodiment.
Figure 2:
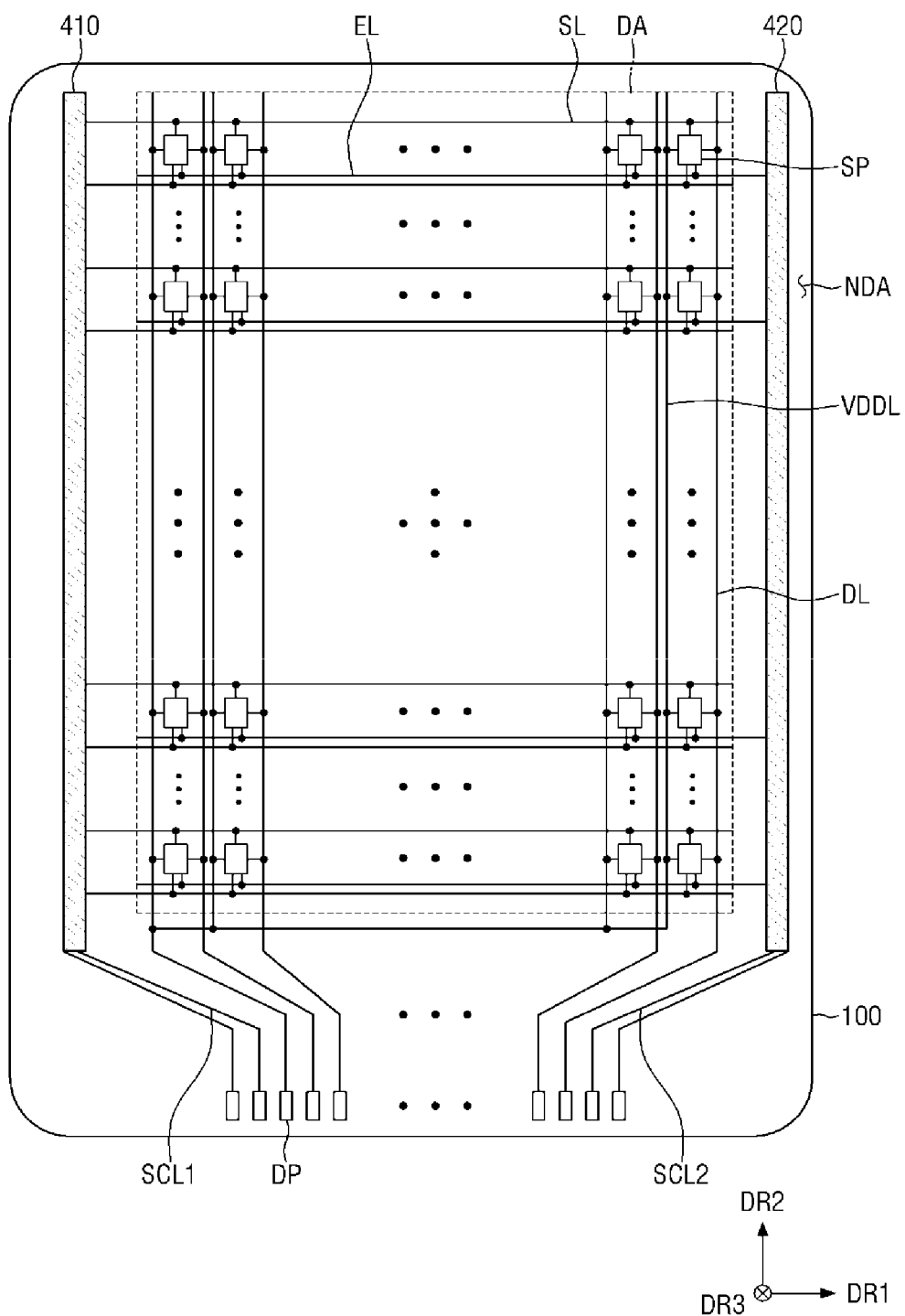
FIG. 2 is a plan view illustrating an example of a display panel according to an embodiment.

FIG. 1 is a perspective view of a display device according to an embodiment, and FIG. 2 is a plan view illustrating an example of a display panel according to an embodiment.

In the present specification, "upper", "top", or "upper surface" refers to one side in an upward direction, that is, a third direction DR3 with respect to a display panel 100, and "lower", "bottom", or "lower surface" refers to the other side in downward direction, that is, the third direction DR3 with respect to the display panel 100.

A display device 10, which is a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 10 may be any one of an organic light emitting display device, a liquid crystal display device, a plasma display device, a field emission display device, an electrophoretic display device, an electrowetting display device, a quantum dot light emitting display device, and a micro light emitting display device. Hereinafter, the display device 10 will be mainly described as an organic light emitting display device, but the present disclosure is not limited thereto.

Referring to FIGS. 1 and 2, the display device 10 includes a display panel 100, a display driver 200, and a circuit board 300.

The display panel 100 may have a rectangular planar shape having short sides in the first direction DR1 and long sides in the second direction DR2. The corner where the short side in the first direction DR1 meets the long side in the second DR2 may be formed to have a round shape having a predetermined curvature or have a right-angled shape. The planar shape of the display panel 100 is not limited to a rectangular shape, and may be formed in another polygonal shape, circular shape, or elliptical shape. The display panel 100 may be formed to be flat, but the present disclosure is not limited thereto. For example, the display panel 100 may include a curved portion formed at the left and right ends thereof and having a constant curvature or a variable curvature. In addition, the display panel 100 may be flexible to be bent, warped, folded, or rolled.

The display panel 100 may include a display area DA where sub-pixels SP are formed to display an image, and a non-display area NDA which is a peripheral area of the display area DA.

The display area DA may be provided with scan lines SL, light emission lines EL, data lines DL, and first driving voltage lines VDDL as well as sub-pixels SP. The scan lines SL and the light emission lines EL are formed in parallel to each other in the first direction DR1, and the data lines DL may be formed in parallel to each other in the second direction DR2 crossing the first direction DR1. The first driving voltage lines VDDL may be formed in parallel to each other in the second direction DR2 in the display area DA. The first driving voltage lines VDDL formed in parallel to each other in the second direction DR2 in the display area DA may be connected to each other in the non-display area NDA.

Each of the sub pixels SP may be connected to at least one of the scan lines SL, any one of the data lines DL, at least one of the light emission lines EL, and any one of the first driving voltage lines VDDL. For convenience of explanation, although it is illustrated in FIG. 2 that each of the sub-pixels SP is connected to two scan lines SL, one data line DL, one light emission line EL, and a first driving voltage line VDDL, the present disclosure is not limited thereto. For example, each of the sub-pixels SP may be connected to three scan lines SL, not two scan lines SL.

Each of the sub-pixels SP may include a driving transistor, at least one switching transistor, a light emitting element, and a capacitor. The driving transistor may emit light by supplying a driving current to the light emitting element according to a data voltage applied to a gate electrode. The driving transistor and the at least one switching transistor may be thin film transistors (TFT). The light emitting element may emit light according to the driving current of the driving transistor. The light emitting element may be an organic light emitting diode including an anode electrode, an organic light emitting layer, and a cathode electrode. The capacitor may serve to maintain the data voltage applied to the gate electrode of the driving transistor for a predetermined period.

The non-display area NDA may cover an area from the outside of the display area DA to the edge of the display panel 100. The non-display area NDA may be provided with a scan driver 410 for applying scan signals to the scan lines SL, and pads DP connected to the data lines DL. Since the circuit board 300 is attached onto the pads DP, the pads DP may be disposed at one edge of the display panel 100, for example, at the lower edge of the display panel 100.

The scan driver 410 may be connected to the display driver 200 through a plurality of first scan control lines SCL1. The scan driver 410 may receive a scan control signal from the pads DP through the plurality of first scan control lines SCL1. The scan driver 410 may generate scan signals according to the scan control signal, and sequentially output the scan signals to the scan lines SL. Sub-pixels SP to which data voltages are to be supplied are selected by scan signals of the scan driver 410, and data voltages are supplied to the selected sub-pixels SP.

A light emission control driver 420 may be connected to the display driver 200 through a plurality of second scan control lines SCL2. The light emission control driver 420 may receive a light emission control signal from the pads DP through the plurality of second scan control lines SCL2. The light emission control driver 420 may generate light emission signals according to the light emission control signal, and sequentially output the light emission signals to the light emission lines EL.

Although it is illustrated in FIG. 2 that the scan driver 410 is disposed left side of the display area DA, and the light emission control driver 420 is disposed right side of the display area DA, the present disclosure is not limited thereto. For example, both of the scan driver 410 and the light emission control driver 420 may be disposed left side of the display area DA simultaneously, or may be disposed right side of the display area DA simultaneously.

The display driver 200 receives digital video data and timing signals from an external source. The display driver 200 converts digital video data into analog positive/negative data voltages and supplies them to the data lines DL. The display driver 200 generates and supplies a scan control signal for controlling an operation timing of the scan driver 410 through the first scan control lines SCL1. The display driver 200 generates and supplies a light emission control signal for controlling an operation timing of the light emission control driver 420 through the second scan control lines SCL2. The display driver 200 may supply a first driving voltage to the first driving voltage line VDDL.

The display driver 200 may be formed as an integrated circuit (IC) and attached onto the circuit board 300 by a COF (chip on film) method. Alternatively, the display driver 200 may be directly attached onto the display panel 100 by a chip on glass (COG) method, a chip on plastic (COP) method, or an ultrasonic bonding method.

The circuit board 300 may be attached onto the pads DP using an anisotropic conductive film. Thus, the lead lines of the circuit board 300 may be electrically connected to the pads DP. The circuit board 300 may be a flexible printed circuit board, a printed circuit board, or a flexible film such as a chip on film.

Figure 3:
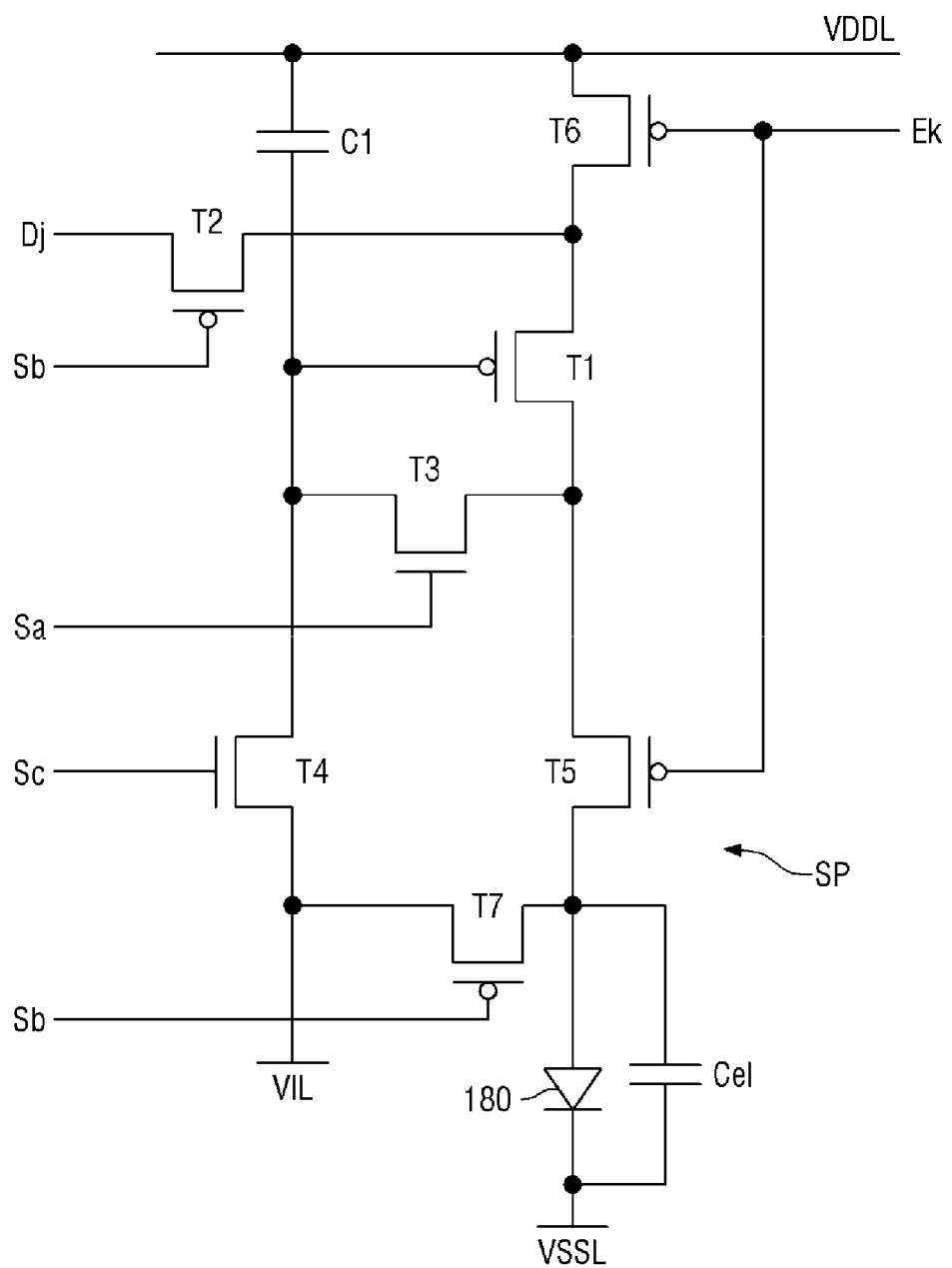
FIG. 3 is a circuit diagram illustrating an example of the sub-pixel of FIG. 2.

FIG. 3 is a circuit diagram illustrating an example of the sub-pixel of FIG. 2.

In FIG. 3, a circuit of one sub-pixel SP of the display device may include an organic light emitting diode 180, a plurality of transistors T1, T2, T3, T4, T5, T6, and T7, and a capacitor C1. In the circuit of one sub-pixel, a data line Dj, a first scan line Sa, a second scan line Sb, a third scan line Sc, a light emission line Ek, a first driving voltage line VDDL, a second driving voltage line VSSL, and an initialization voltage line VIL may be connected to each other.

The organic light emitting diode 180 may include an anode electrode and a cathode electrode. The capacitor C1 may include a first electrode and a second electrode.

The plurality of transistors may include first to seventh transistors T1, T2, T3, T4, T5, T6, and T7. Each of the transistors T1, T2, T3, T4, T5, T6, and T7 may include a gate electrode, a first electrode, and a second electrode. One of the first electrode and second electrode of each of the transistors T1, T2, T3, T4, T5, T6, and T7 may be a source electrode, and the other thereof may be a drain electrode.

Each of the transistors T1, T2, T3, T4, T5, T6, and T7 may be a thin film transistor. Each of the transistors T1, T2, T3, T4, T5, T6, and T7 may be one of a PMOS transistor and an NMOS transistor. In an embodiment, the first transistor T1 as a driving transistor, the second transistor T2 as a data transfer transistor, the fifth transistor T5 as a first light emission control transistor, the sixth transistor T6 as a second light emission control transistor, and the seventh transistor T7 as a second initialization transistor are PMOS transistors. In contrast, the third transistor T3 as a compensation transistor and the fourth transistor T4 as a first initialization transistor are NMOS transistors. PMOS transistors and NMOS transistors have different characteristics. In this case, since the third transistor T3 and the fourth transistor T4 are formed as NMOS transistors having relatively excellent turn-off characteristics, leakage of a driving current during the emission period of the organic light emitting diode OLED may be reduced.

Hereinafter, each of the components will be described in detail.

The gate electrode of the first transistor T1 is connected to the first electrode of the capacitor C1. The first electrode of the first transistor T1 is connected to a terminal of the first driving voltage line VDDL via the sixth transistor T6. The second electrode of the first transistor T1 is connected to the anode electrode of the organic light emitting diode 180 through the fifth transistor T5. The first transistor T1 receives data signal DATA according to the switching operation of the second transistor T2 and supplies a driving current to the organic light emitting diode 180.

The gate electrode of the second transistor T2 is connected to a terminal of the second scan line Sb. The first electrode of the second transistor T2 is connected to a terminal of the data line Dj. The second electrode of the second transistor T2 is connected to the first electrode of the first transistor T1 and is connected to the terminal of the first driving voltage line VDDL via the sixth transistor T6. The second transistor T2 is turned on according to a signal applied to the second scan line Sb, and performs a switching operation of transmitting the data signal applied through the data line Dj to the first electrode of the first transistor T1.

The gate electrode of the third transistor T3 is connected to a terminal of the first scan line Sa. The first electrode of the third transistor T3 is connected to the second electrode of the first transistor T1 and the anode electrode of the organic light emitting diode 180 via the fifth transistor T5. The second electrode of the third transistor T3 is connected to the first electrode of the capacitor C1, the first electrode of the fourth transistor T4, and the gate electrode of the first transistor T1. The third transistor T3 is turned on according to a signal of the first scan line Sa to connect the gate electrode and second electrode of the first transistor T1 to each other to diode-connect the first transistor T1. Accordingly, a voltage difference is generated between the first electrode and gate electrode of the first transistor T1 by the threshold voltage of the first transistor T1, and a data signal compensated for the threshold voltage may be supplied to the gate electrode of the first transistor T1, thereby compensating for a threshold voltage deviation of the first transistor T.

The gate electrode of the fourth transistor T4 is connected to a terminal of the third scan line Sc. The second electrode of the fourth transistor T4 is connected to a terminal of the initialization voltage line VIL. The first electrode of the fourth transistor T4 is connected to the first electrode of the capacitor C1, the second electrode of the third transistor T3, and the gate electrode of the first transistor T1. The fourth transistor T4 is turned on according to the signal of the third scan line Sc and transmits the initialization voltage signal of the initialization voltage line VIL to the gate electrode of the first transistor T1 to perform an operation of initializing the voltage of the gate electrode of the first transistor T1.

The gate electrode of the fifth transistor T5 is connected to a terminal of the light emission line Ek. The first electrode of the fifth transistor T5 is connected to the second electrode of the first transistor T1 and the first electrode of the third transistor T3. The second electrode of the sixth transistor T6 is connected to the anode electrode of the organic light emitting diode 180.

The gate electrode of the sixth transistor T6 is connected to a terminal of the light emission line Ek. The first electrode of the sixth transistor T6 is connected to a terminal of the first driving voltage line VDDL. The second electrode of the sixth transistor T6 is connected to the first electrode of the first transistor T1 and the second electrode of the second transistor T2.

The fifth transistor T5 and the sixth transistor T6 are simultaneously turned on according to the light emission control signal of the light emission line Ek, and accordingly, a driving current flows through the organic light emitting diode 180.

The gate electrode of the seventh transistor T7 is connected to a terminal of the second scan line Sb. The first electrode of the seventh transistor T7 is connected to the anode electrode of the organic light emitting diode 180. The second electrode of the seventh transistor T7 is connected to a terminal of the initialization voltage line VIL. The seventh transistor T7 is turned on according to the light emission control signal of the light emission line Ek to initialize the anode electrode of the organic light emitting diode 180.

In this embodiment, a case where the gate electrode of the seventh transistor T7 receives a signal from the second scan line Sb is exemplified, but as another embodiment, the pixel circuit may be configured such that the gate electrode of the seventh transistor T7 receives the light emission control signal from the light emission line Ek. That is, the gate electrode of the seventh transistor T7 may be connected to the light emission liner Ek.

The second electrode of the capacitor C1 is connected to the terminal of the first driving voltage line VDDL. The first electrode of the capacitor C1 is connected to the gate electrode of the first transistor T1, the second electrode of the third transistor T3, and the first electrode of the fourth transistor T4. The cathode electrode of the organic light emitting diode 180 is connected to a terminal of the second driving voltage line VSSL. The organic light emitting diode 180 receives a driving current from the first transistor T1 and emits light to display an image.

Each of the first to seventh transistors T1, T2, T3, T4, T5, T6, and T7 may include a semiconductor layer. Some of the first to seventh transistors T1, T2, T3, T4, T5, T6, and T7 may include semiconductor layers made of polycrystalline silicon, and others of the first to seventh transistors T1, T2, T3, T4, T5, T6, and T7 may include semiconductor layers made of oxide. For example, the semiconductor layers of the first to seventh transistors T1, T2, T3, T4, T5, T6, T7 are made of polycrystalline silicon, or the semiconductor layers of the first and fifth to seventh transistors T1, T5, T6, and T7 of the first to seventh transistors T1, T2, T3, T4, T5, T6, and T7 are made of polycrystalline silicon, and the semiconductor layers of the third and fourth transistors T3 and T4 of the first to seventh transistors T1, T2, T3, T4, T5, T6, and T7 are made of oxide. For example, the semiconductor layer of the driving transistor may include polycrystalline silicon, and the semiconductor layer of the switching transistor may include oxide.

The semiconductor layer of the switching transistor may include a first channel region overlapping the gate electrode of the switching transistor, a first drain region located at one side of the first channel region, and a first source region located at the other side of the first channel region. The semiconductor layer of the driving transistor may include a second channel region overlapping the gate electrode of the driving transistor, a second drain region located at one side of the second channel region, and a second source region located at the other side of the second channel region.

Meanwhile, the above-described display device 10 may include a flexible substrate such as a plastic substrate in order to implement the display device 10 that can be warped or bent. For example, the display device 10 may include a polyimide substrate. The polyimide substrate is a flexible substrate, and may be used as a substrate of various flexible display devices. However, in the polyimide substrate, a charging phenomenon in which charges are collected on the surface thereof may occur, and electrical characteristics of a thin film transistor adjacent to the substrate may be deteriorated due to this charge phenomenon.

For example, when a silicon oxide layer and an amorphous silicon layer are disposed between multi-layered polyimide substrates, electric charges may be generated when the amorphous silicon layer is irradiated with light. When the transistor is driven, charges are trapped between the amorphous silicon layer and the polyimide substrate, thereby causing a shift in gate voltage of the transistor. Accordingly, optical afterimages of the display device may occur. Accordingly, although it is possible to consider the omission of the amorphous silicon layer interposed to improve adhesion force, in the case of the silicon oxide layer disposed between the polyimide substrates, the adhesive between the organic material and the inorganic material is low, so that the polyimide substrate may be lifted.

Hereinafter, a display device capable of improving a charging phenomenon of a substrate to prevent the deterioration of characteristics of a thin film transistor and to improve adhesion force will be described.

Figure 4:
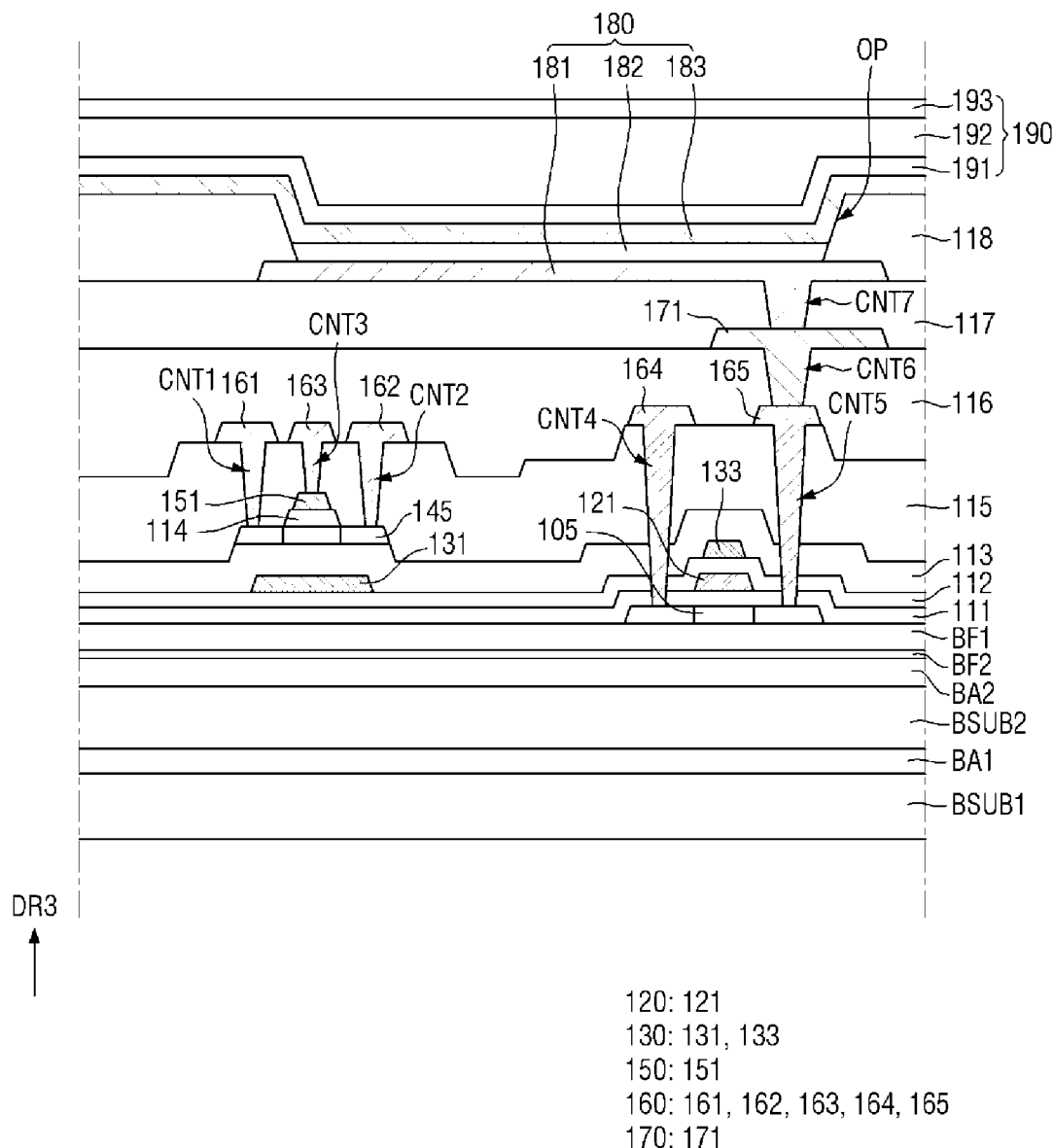
FIG. 4 is a cross-sectional view of a display device according to an embodiment.

FIG. 4 is a cross-sectional view of a display device according to an embodiment.

Referring to FIG. 4, a display device 10 according to an embodiment may include a first base substrate BSUB1, a first barrier layer BA1 disposed on the first base substrate BSUB1, a second base substrate BSUB2 disposed on the first barrier layer BA1, a second barrier layer BA2 disposed on the second base substrate BSUB2, buffer layers BF1 and BF2 disposed on the second barrier layer BA2, a switching transistor ST disposed on the buffer layers BF1 and BF2, a driving transistor DT, and an organic light emitting diode 180.

Specifically, the first base substrate BSUB1 supports each of the layers disposed thereon. For the first base substrate BSUB1, a transparent substrate may be used when an organic light emitting display device is a rear-side or double-sided emission type display device. When the organic light emitting display device is a top emission type display device, a translucent or opaque substrate as well as a transparent substrate may be applied. The first base substrate BSUB1 may include a flexible material such as plastic, and may be, for example, polyimide.

The first barrier layer BA1 may be disposed on the first base substrate BSUB1. The first barrier layer BA1 may prevent the diffusion of impurity ions, may prevent the penetration of moisture or external air, and may perform a surface planarization function. Further, the first barrier layer BA1 may serve to impart adhesive properties between the first base substrate BSUB1 and the second base substrate BSUB2. For example, the first barrier layer BA1 may contact the upper surface of the first base substrate BSUB1 and the lower surface of the second base substrate BSUB2, respectively.

The first barrier layer BA1 may include silicon oxide (SiOx). In an embodiment, in order to improve the adhesion force of the first barrier layer BA1 which is disposed between the first base substrate BSUB1 and the second base substrate BSUB2, when silicon oxide which will be described later is prepared, the ratio of $SiH_4$ gas to $N_2O$ gas may be adjusted to 22 or less. For example, the ratio of $SiH_4$ gas to $N_2O$ gas may range from 19 to 22.

Mechanisms for imparting adhesion force to silicon oxide (SiOx) at the interface between the first base substrate BSUB1 and the second base substrate BSUB2 include, for example, dipole-dipole interaction, hydrogen bonding, hydrogen bonding, and mechanical anchoring.

The dipole-dipole interaction may refer to an electrical interaction between polar molecules having dipoles respectively included in the silicon oxide of the first barrier layer BA1 and the polyimide of the second base substrate BSUB2. The hydrogen bonding may refer to chemical bonding between hydrogen of silicon oxide of the first barrier layer BA1 and polyimide of the second base substrate BSUB2. The mechanical anchoring may refer to physical bonding formed by filling the fine irregularities on the surface of the silicon oxide of the first barrier layer BA1 with the polyimide of the second base substrate BSUB2.

In an embodiment, when the ratio of $SiH_4$ gas to $N_2O$ gas is adjusted to 22 or less when preparing the silicon oxide of the first barrier layer BA1, the content of hydrogen in the silicon oxide may increases, and a porous film quality may be obtained. For example, the content of hydrogen in the silicon oxide of the first barrier layer BA1 may be 1.20E+21 atom/cm$^3$ or more. Accordingly, the content of hydrogen in the silicon oxide of the first barrier layer BA1 may increase to increase a dipole site, thereby increasing the dipole-dipole interaction with the polyimide of the second base substrate BSUB2. Further, since the content of hydrogen in the silicon oxide of the first barrier layer BA1 increases, a bond (O—H) between oxygen and hydrogen in the polyimide of the second base substrate BSUB2 or a bond (N—H) between nitrogen and hydrogen in the polyimide thereof. Still further, since the silicon oxide of the first barrier layer BA1 is formed into a porous film, the polyimide of the second base substrate BSUB2 penetrates into the porous film, so that mechanical anchoring may be increased.

As a result, when the ratio of $SiH_4$ gas to $N_2O$ gas in the formation of the silicon oxide of the first, barrier layer BA1 is adjusted to 22 or less, the adhesion force between the silicon oxide of the first barrier layer BA1 and the polyimide of the second base substrate BSUB2 and the adhesion force between the silicon oxide of the first harrier layer BA1 and the first base substrate BSUB1 may increase. The first harrier layer BA1 may have an adhesion force of 200 gf/inch or more with the second base substrate BSUB2 and an adhesion force of 200 gf/inch or more with the first base substrate BSUB1.

In an embodiment, the first barrier layer BA1 may have a dielectric constant in the range of about from 4 to 6. When the first barrier layer BA1 disposed between the first base substrate BSUB1 and the second base substrate BSUB2 has a dielectric constant of about from 4 to 6, a value of a capacitor generated due to electric charging at the interface therebetween may be lowered, shifting of the gate voltage of the above-described transistor may be improved, thereby reducing an optical afterimage of the display device.

The first barrier layer BA1 may have a film stress of −230 MPa or more. The above-described display device is a flexible display device. When the film stress of the first barrier layer BA1 increases to −230 MPa or more, tensile properties are further exhibited, thereby improving flexible properties.

Meanwhile, the second base substrate BSUB2 may be disposed on the first barrier layer BA1. The second base substrate BSUB2 may include a flexible material such as plastic, and may include, for example, polyimide.

A second barrier layer BA2 may be disposed on the second base substrate BSUB2. The second barrier layer BA2 may prevent the diffusion of impurity ions, may prevent the penetration of moisture or external air, and may perform a surface planarization function. The second barrier layer BA2 may include silicon nitride, silicon oxide, or silicon nitride oxide.

A second buffer layer BF2 may be disposed on the second barrier layer BA2. The second buffer layer BF2 serves to supply hydrogen to a polysilicon semiconductor layer 105 which will be described later. The second buffer layer BF2 may include silicon nitride, silicon oxide, or silicon oxynitride, and preferably may include silicon nitride.

The first buffer layer BF1 may be disposed on the second buffer layer BF2. The first buffer layer BF1 may include silicon nitride, silicon oxide, or silicon oxynitride.

The polysilicon semiconductor layer 105 may be disposed on the first buffer layer BF1. The polycrystalline silicon semiconductor layer 105 may be made of amorphous silicon or poly silicon. In this case, the crystalline silicon may be formed by crystallizing amorphous silicon. In the method of crystallizing amorphous silicon, amorphous silicon may be crystallized by various methods such as rapid thermal annealing (RTA), solid phase crystallization (SPC), excimer laser annealing (ELA), metal induced crystallization (MIC), metal induced lateral crystallization (MILC), and sequential lateral solidification (SLS).

The polysilicon semiconductor layer 105 includes a second channel region overlapping the second gate electrode 121 in the thickness direction, that is, in the third direction DR3, a second drain region located at one side of the second channel region, and a second source region located at the other side of the second channel region.

A lower gate insulating layer 111 may be disposed on the polysilicon semiconductor layer 105. The lower gate insulating layer 111 may be a gate insulating layer having a gate insulating function. The lower gate insulating layer 111 may include a silicon compound or a metal oxide. For example, the lower gate insulating layer 111 may include silicon oxide, silicon nitride, silicon oxynitride, aluminum oxide, tantalum oxide, hafnium oxide, zirconium oxide, or titanium oxide. They may be used alone or in combination with each other. The lower gate insulating layer 111 may be a single layer or multiple layers made of different materials.

A first conductive layer 120 may be disposed on the lower gate insulating layer 111. The first conductive layer 120 may include a second gate electrode 121. The first conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The first conductive layer 120 may be a single layer or multiple layers.

An upper gate insulating layer 112 may be disposed on the first conductive layer 120 including the second gate electrode 121. The upper gate insulating layer 112 may be a gate insulating layer having a gate insulating function. The upper gate insulating layer 112 may include a silicon compound or a metal oxide. For example, the upper gate insulating layer 112 may include silicon oxide, silicon nitride, silicon oxynitride, aluminum oxide, tantalum oxide, hafnium oxide, zirconium oxide, or titanium oxide. They may be used alone or in combination with each other. The upper gate insulating layer 112 may be a single layer or multiple layers made of different materials.

A second conductive layer 130 may be disposed on the upper gate insulating layer 112. The second conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 130 may be a single layer or multiple layers.

The second conductive layer 130 may include a first lower gate electrode 131 and a capacitor electrode 133. The first lower gate electrode 131 may be disposed to overlap the first channel region of the oxide semiconductor layer 145 in the thickness direction, and the capacitor electrode 133 may be disposed to overlap the second channel region of the polysilicon semiconductor layer 105 in the thickness direction which is equivalent to the third direction DR3.

A lower interlayer insulating layer 113 may be disposed on the second conductive layer 130. The lower interlayer insulating layer 113 may include a silicon compound or a metal oxide. For example, the lower interlayer insulating layer 113 may include silicon oxide, silicon nitride, silicon oxynitride, aluminum oxide, tantalum oxide, hafnium oxide, zirconium oxide, or titanium oxide. They may be used alone or in combination with each other. The lower interlayer insulating layer 113 may be a single layer or multiple layers made of different materials.

An oxide semiconductor layer 145 may be disposed on the lower interlayer insulating layer 113. The oxide semiconductor layer 145 may include an oxide. The oxide may include an oxide of at least one selected from Zinc (Zn), indium (In), gallium (Ga), tin (Sn) cadmium (Cd), germanium (Ge), or hafnium (Hf), and a combination thereof. The oxide may include at least one of indium-gallium-zinc oxide (IGZO), zinc-tin oxide (ZTO), and indium-tin oxide (ITO).

A first gate insulating layer 114 may be disposed on the oxide semiconductor layer 145. The first gate insulating layer 114 may be a gate insulating layer having a gate insulating function. The first gate insulating layer 114 may include a silicon compound or a metal oxide. For example, the first gate insulating layer 114 may include silicon oxide, silicon nitride, silicon oxynitride, aluminum oxide, tantalum oxide, hafnium oxide, zirconium oxide, or titanium oxide. They may be used alone or in combination with each other. The first gate insulating layer 114 may be a single layer or multiple layers made of different materials.

A portion of the upper surface of the first source region of the oxide semiconductor layer 145 and a portion of the upper surface of the first drain region of the oxide semiconductor layer 145 may be exposed by the first gate insulating layer 114, respectively. The first gate insulating layer 114 may be disposed to overlap the first channel region of the oxide semiconductor layer 145 in the thickness direction which is equivalent to the third direction DR3, and may be disposed so as not to overlap the first source region and first drain region of the oxide semiconductor layer 145.

A third conductive layer 150 may be disposed on the first gate insulating layer 114. The third conductive layer 150 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The third conductive layer 150 may be a single layer or multiple layers.

The third conductive layer 150 may include a first upper gate electrode 151. The first upper gate electrode 151 may be disposed to overlap the first gate insulating layer 114 in the thickness direction which is equivalent to the third direction DR3.

In an embodiment, the gate electrode of the switching transistor may be a double gate electrode including a first upper gate electrode 151 and a first lower gate electrode 131. The first upper gate electrode 151 and the first lower gate electrode 131 may be electrically connected to each other. The capacitor electrode 133 and the second gate electrode 121 may form a capacitor by interposing an upper gate insulating layer 112 therebetween.

An upper interlayer insulating layer 115 may be disposed on the third conductive layer 150. The upper interlayer insulating layer 115 may cover the first upper gate electrode 151, the side surface of the first gate insulating layer 114, and the exposed upper surface of the oxide semiconductor layer in the first source region and the first drain region. The upper interlayer insulating layer 115 may include a silicon compound or a metal oxide. For example, the upper interlayer insulating layer 115 may include silicon oxide, silicon nitride, silicon oxynitride, aluminum oxide, tantalum oxide, hafnium oxide, zirconium oxide, or titanium oxide. They may be used alone or in combination with each other. The upper interlayer insulating layer 115 may be a single layer or multiple layers made of different materials.

A fourth conductive layer 160 may be disposed on the upper interlayer insulating layer 115. The fourth conductive layer 160 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fourth conductive layer 160 may be a single layer or multiple layers.

The fourth conductive layer 160 may include a first source electrode 161, a first drain electrode 163, a second source electrode 164, and a second drain electrode 165. The fourth conductive layer 160 may further include a first connection electrode 163.

The first source electrode 161 and the first drain electrode 163 may be connected to the first source region and first drain region of the oxide semiconductor layer 145, respectively, through first and second contact holes CNT1 and CNT2 penetrating the upper interlayer insulating layer 115, and the second source electrode 164 and the second drain electrode 165 may be connected to the second source region and second drain region of the polysilicon semiconductor layer 105, respectively, through fourth and fifth contact holes CNT4 and CNT5 penetrating the upper interlayer insulating layer 115, the lower interlayer insulating layer 113, and the gate insulating layers 111 and 112.

The first connection electrode 163 may be connected to the first upper gate electrode 151 through a third contact hole CNT3 penetrating through the upper interlayer insulating layer 115. The first connection electrode 163 may be electrically connected to the first upper gate electrode 151, thereby lowering the resistance of the first upper gate electrode 151.

A first via layer 116 may be disposed on the fourth conductive layer 160. The first via layer 116 may include an inorganic insulating material or may include an organic insulating material such as acrylic resin, epoxy resin, phenolic resin, polyamide resin, polyimide resin, unsaturated polyester resin, polyphenylene ether resin, polyphenylenesulfide resin, or benzocyclobutene (BCB). The first via layer 116 may be a single layer or multiple layers.

A fifth conductive layer 170 which includes a second connection electrode 171 may be disposed on the first via layer 116. The fifth conductive layer 170 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fifth conductive layer 170 may be a single layer or multiple layers.

The second connection electrode 171 may be connected to the second drain electrode 165 through a sixth contact hole CNT6 penetrating a portion of the first via layer 116 to expose the upper surface of the second drain electrode 165. A second via layer 117 may be disposed on the fifth conductive layer 170. The second via layer 117 may be formed in the same manner as the above-describe first via layer 116.

An anode electrode 181 may be disposed on the second via layer 117. The anode electrode 181 may be connected to the second connection electrode 171 through a seventh contact hole CNT7 penetrating the second via layer 117. The anode electrode 181 may be disposed separately for each sub-pixel ("SP" in FIG. 2).

A bank layer 118 may be disposed on the anode electrode 181. The bank layer 118 may include an opening OP partially exposing the anode electrode 181. The bank layer 118 may include an organic insulating material or an inorganic insulating material. For example, the bank layer 118 may include at least one of a photoresist, a polyimide resin, an acrylic resin, a silicone compound, and a polyacrylic resin.

An organic light emitting layer 182 may be disposed on the upper surface of the anode electrode 181 and in the opening OP of the bank layer 118. A cathode electrode 183 may be disposed on the organic light emitting layer 182 and the bank layer 118. The cathode electrode 183 may be a common electrode disposed over a plurality of pixels.

The anode electrode 181, the organic light emitting layer 182, and the cathode electrode 183 may constitute an organic light emitting diode 180.

An encapsulation layer 190 may be disposed on the cathode electrode 183. The encapsulation layer 190 may cover the organic light emitting diode 180. The encapsulation layer 190 may be a laminated layer in which inorganic layers and organic layers are alternately stacked. For example, the encapsulation layer 190 may include a first encapsulation inorganic layer 191, an encapsulation organic layer 192, and a second encapsulation inorganic layer 193, which are sequentially stacked.

Hereinafter, a method of manufacturing a display device according to the embodiment of FIG. 4 will be described.

Figure 5:
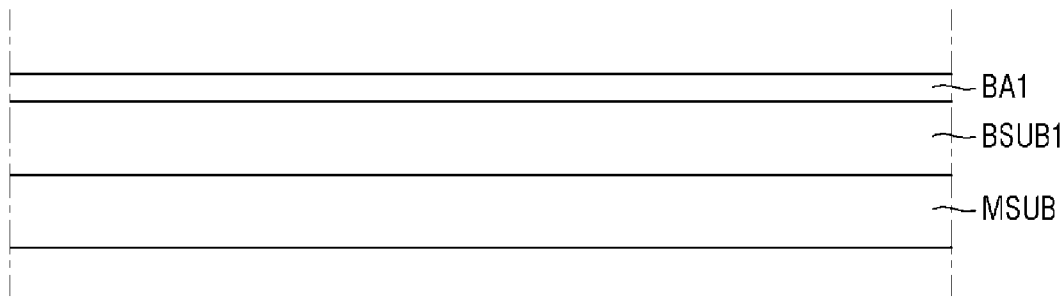
FIGS. 5, 6, and 7 are cross-sectional views illustrating a method of manufacturing a display device according to an embodiment.
Figure 6:
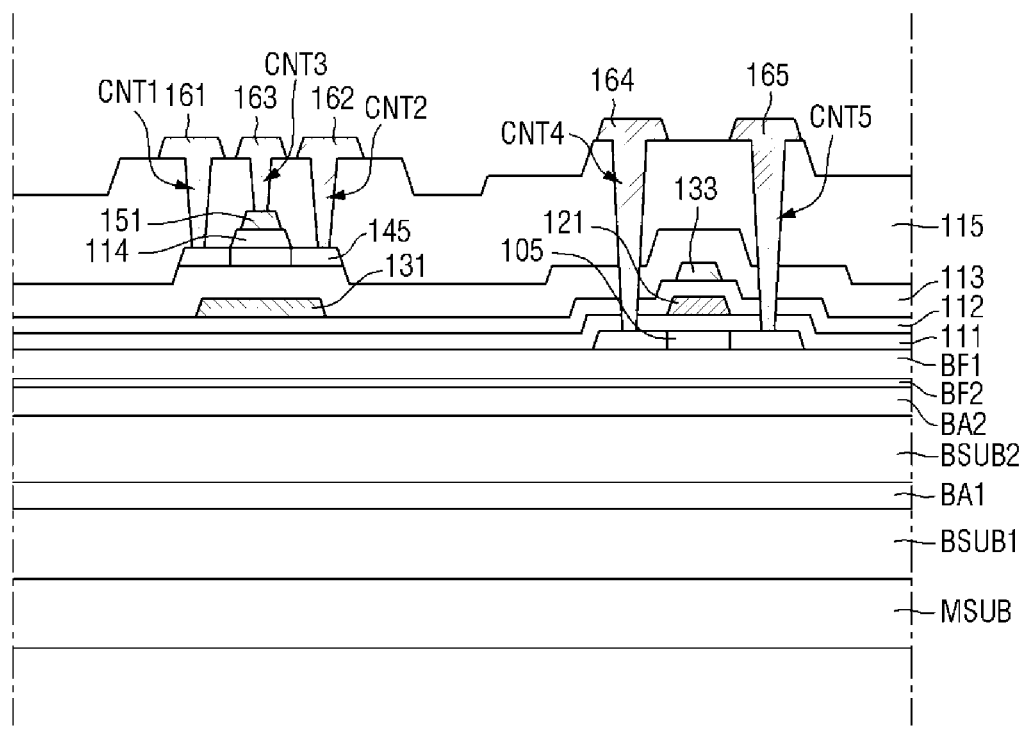
Figure 7:
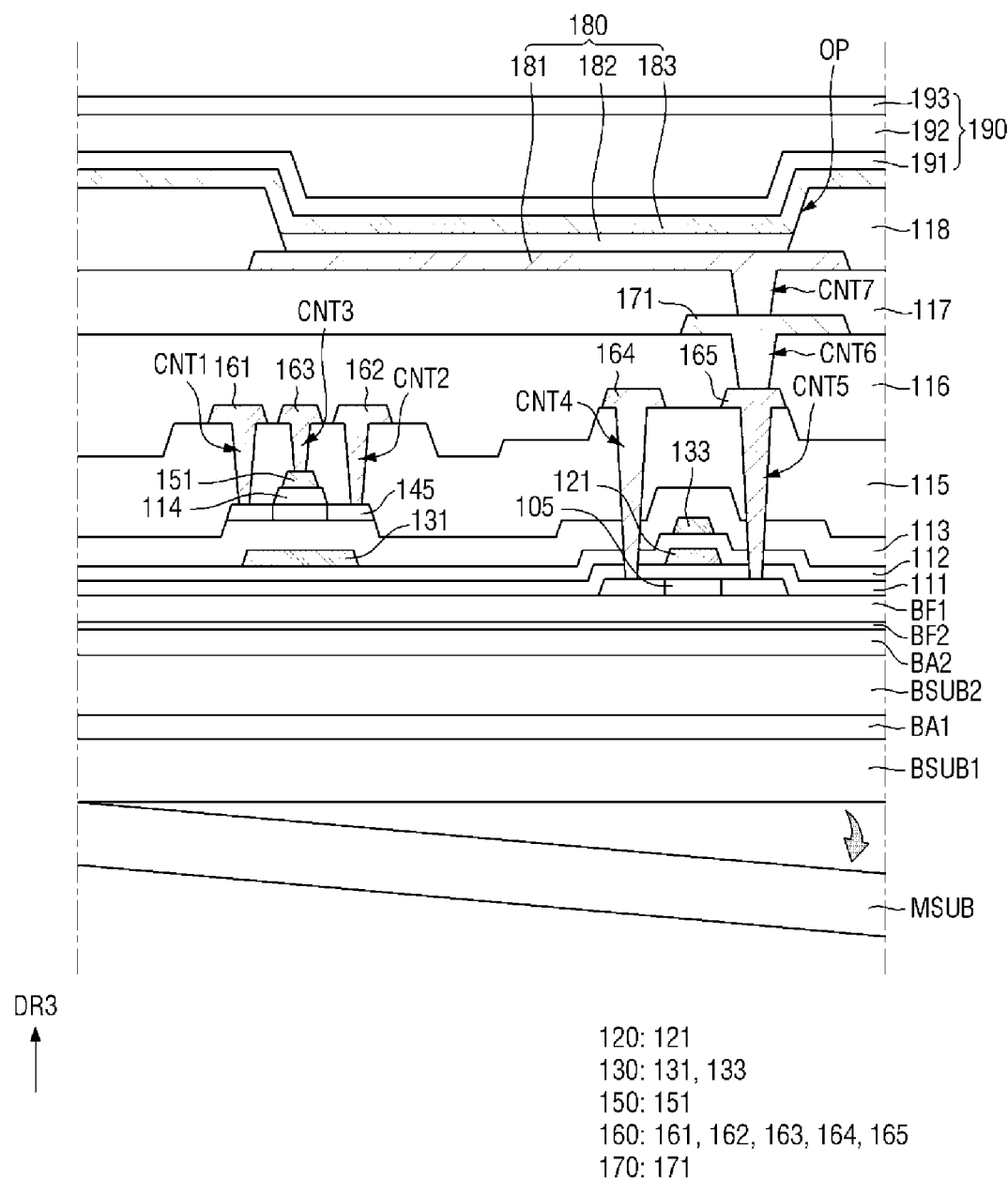

FIGS. 5, 6, and 7 are cross-sectional views illustrating a method of manufacturing a display device according to an embodiment.

Referring to FIG. 5, firstly, a first base substrate BSUB1 is formed on a support substrate MSUB. The support substrate MSUB may be a rigid substrate serving to support overlying elements. For example, the support substrate MSUB may be a glass substrate. The first base substrate BSUB1 may be formed by applying polyimide onto the support substrate MSUB by a solution process.

Subsequently, a first barrier layer BA1 is formed on the first base substrate BSUB1. The first barrier layer BA1 may include silicon oxide, and may be formed by a chemical vapor deposition (CVD) using $N_2O$ gas and $SiH_4$ gas. The first barrier layer BA1 may be formed in a chamber at a pressure of 900 mTorr to 1,100 mTorr and a temperature of 350° C. to 400° C. with a power of 8,000 W to 10,000 W. For example, the first barrier layer BA1 may be formed in a chamber at a pressure of 1,000 mTorr and a temperature of 370° C. with a power of 8,930 W. The first barrier layer BA1 may be formed to have a thickness of about 5,000 Å to about 7,000 Å.

In an embodiment, the first barrier layer BA1 may be formed by adjusting the flow rates of $N_2O$ gas and $SiH_4$ gas such that the ratio of $SiH_4$ gas to $N_2O$ gas is 22 or less. For example, the ratio of $SiH_4$ gas to $N_2O$ gas may be about 19 to 22. In an embodiment, the flow rate of $N_2O$ gas is reduced to relatively increase the ratio of $SiH_4$ gas so that the content of hydrogen in the prepared silicon oxide film may be increased, and the silicon oxide may be prepared to have porous film quality.

Accordingly, the content of hydrogen in the silicon oxide of the first barrier layer BA1 increases to increase dipole sites so that a dipole-dipole interaction between polyimide of the first base substrate BUSB1 and polyimide of the second base substrate BSUB2 may increase. Further, the content of hydrogen in the silicon oxide of the first barrier layer BA1 increases to increase dipole sites so that a bond (O—H) of oxygen and hydrogen in the polyimide of the first base substrate BUSB1 and the second base substrate BSUB2 and/or a bond (N—H) of nitrogen and hydrogen in the polyimide thereof may increase. Further, since the silicon oxide of the first barrier layer is formed into a porous film, the polyimide of the base substrate BUSB1 and the polyimide of the second base substrate BSUB2 penetrate into the porous film so that mechanical anchoring may increase.

As a result, when the ratio of SiH$_4$ gas to N$_2$O gas in the formation of the silicon oxide of the first barrier layer BA1 is adjusted to 22 or less, the adhesion force between the silicon oxide of the first barrier layer BA1 and the polyimide of the second base substrate BSUB2 and the adhesion force between the silicon oxide of the first barrier layer BA1 and the first base substrate BSUB1 may increase.

Subsequently, referring to FIG. 6, polyimide is applied onto the first barrier layer BA1 by a solution process to form a second base substrate BSUB2. The second base substrate BSUB2 may be the same as the above-described first base substrate BSUB1. Silicon nitride, silicon oxide, or silicon oxynitride is deposited on the second base substrate BSUB2 by a chemical vapor deposition method to form a second barrier layer BA2.

Next, a second buffer layer BF2 and a first buffer layer BF1 are sequentially formed on a second barrier layer BA2. The first buffer layer BF1 and the second buffer layer BF2 may be entirely formed on the second barrier layer BA2, and may be deposited by a chemical vapor deposition method. Each of the first buffer layer BF1 and the second buffer layer BF2 may be formed as a single layer of silicon nitride, silicon oxide, or silicon nitride oxide, or multiple layers thereof.

Then, amorphous silicon is deposited on the first buffer layer BF1 by a chemical vapor deposition method and crystallized to form a polycrystalline silicon semiconductor layer 105. Silicon nitride, silicon oxide, or silicon nitriate is deposited on the support substrate MSUB provided with the polysilicon semiconductor layer 105 by a chemical vapor deposition method to form a lower gate insulating layer 111.

Next, a metal is deposited on the lower gate insulating layer 111 by a physical vapor deposition (PVD) method and patterned to form a first conductive layer 120. The first conductive layer 120 may be formed to include a second gate electrode 121. Silicon nitride, silicon oxide, or silicon oxynitride is deposited on the support substrate MSUB provided with the first conductive layer 120 by a chemical vapor deposition method to form an upper gate insulating layer 112.

Subsequently, a metal is deposited on the upper gate insulating layer 112 by a physical vapor deposition (PVD) method and patterned to form a second conductive layer 130. The second conductive layer 130 may be formed to include first upper gate electrode 131 and a capacitor electrode 133. Silicon nitride, silicon oxide, or silicon oxynitride is deposited on the support substrate MSUB provided with the second conductive layer 130 by a chemical vapor deposition method to form a lower interlayer insulating layer 113.

Next, a plurality of oxide materials are deposited on the lower interlayer insulating layer 113 using a chemical vapor deposition method or a physical vapor deposition method to form an oxide semiconductor layer 145. Silicon nitride, silicon oxide, or silicon oxynitride is deposited on the support substrate MSUB provided with the oxide semiconductor layer 145 by a chemical vapor deposition method to form a first gate insulating layer 114.

Subsequently, a metal is deposited on the first gate insulating layer 114 by a physical vapor deposition (PVD) method and patterned to form a third conductive layer 150. The third conductive layer 150 may be formed to include first upper gate electrode 151. Silicon nitride, silicon oxide, or silicon oxynitride is deposited on the support substrate MSUB provided with the third conductive layer 150 by a chemical vapor deposition method to form an upper interlayer insulating layer 115. The upper interlayer insulating layer 115 is etched to form first, second, and third contact holes CNT1, CNT2, CNT3 penetrating the upper interlayer insulating layer 115, and to form fourth and fifth contact holes CNT4 and CNT5 penetrating the upper interlayer insulating layer 115, the lower interlayer insulating layer 113, and the gate insulating layers 111 and 112.

Subsequently, a metal is deposited on the upper interlayer insulating layer 115 by a physical vapor deposition (PVD) method and patterned to form a fourth conductive layer 160. The fourth conductive layer 160 may be formed to include a first source electrode 161, a first drain electrode 163, a second source electrode 164, a second drain electrode 165, and a first connection electrode 163. The first source electrode 161 and the first drain electrode 163 may be connected to the first source region and first drain region of the oxide semiconductor layer 145, respectively, through the first and second contact holes CNT1 and CNT2 penetrating the upper interlayer insulating layer 115, and the second source electrode 164 and the second drain electrode 165 may be connected to the second source region and second drain region of the polysilicon semiconductor layer 105, respectively, through the fourth and fifth contact holes CNT4 and CNT5 penetrating the upper interlayer insulating layer 115, the lower interlayer insulating layer 113, and the gate insulating layers 111 and 112. The first connection electrode 163 may be connected to the first upper gate electrode 151 through the third contact hole CNT3 penetrating through the upper interlayer insulating layer 115.

Next, referring to FIG. 7, an inorganic insulating material or an organic insulating material is applied on the support substrate MSUB provided with the fourth conductive layer 160 to form a first via layer 116. For example, the first via layer 116 may be formed by applying an organic insulating material onto the support substrate MSUB through a solution process. Subsequently, the first via layer 116 is etched to partially penetrate the first via layer 116 to form a sixth contact hole CNT6 exposing the upper surface of the second drain electrode 165.

Next, a metal is deposited on the support substrate MSUB provided with the first via layer 116 by a physical vapor deposition (PVD) method and patterned to form a fifth conductive layer 170. The fifth conductive layer 170 may be formed to include a second connection electrode 171. The second connection electrode 171 may be connected to the second drain electrode 165 through the sixth contact hole CNT6 penetrating a portion of the first via layer 116 to expose the upper surface of the second drain electrode 165. Subsequently, an inorganic insulating material or an organic insulating material is applied onto the support substrate MSUB provided with the fifth conductive layer 170 to form a second via layer 117. The second via layer 117 is etched to partially penetrate the second via layer 117 to form a seventh contact hole CNT7 exposing the upper surface of the second connection electrode 171.

Next, an anode electrode material is applied onto the second via layer 117 and patterned to form an anode electrode 181. The anode electrode material may be a transparent conductive oxide, for example, indium tin oxide (ITO) or indium zinc oxide (IZO). The anode electrode 181 may be connected to the second connection electrode 171 through the seventh contact hole CNT7.

Subsequently, an organic insulating material is applied onto the support substrate MSUB provided with the anode electrode 181 by a solution process to form a bank layer 118. A portion of the bank layer 118 is etched to form an opening OP partially exposing the anode electrode 181.

Next, an organic light emitting material is deposited on the support substrate MSUB provided with the bank layer 118 to form an organic light emitting layer 182. The organic light emitting layer 182 may further include at least one organic functional layer selected from a hole transport layer, a hole injection layer, an electron transport layer, and an electron injection layer.

Subsequently, a cathode electrode material, for example, a metal or a transparent conductive oxide is deposited on the support substrate MSUB provided with the organic light emitting layer 182 to form a cathode electrode 183. The anode electrode 181, the organic light emitting layer 182, and the cathode electrode 183 may constitute an organic light emitting diode 180.

Next, an inorganic insulating material is sequentially deposited on the support substrate MSUB provided with the organic light emitting diode 180 to form an encapsulation layer 190. The encapsulation layer 190 may be formed by alternately depositing an organic insulating material or an inorganic insulating material. The encapsulation layer 190 may be a laminated layer in which inorganic layers and organic layers are alternately stacked. For example, the encapsulation layer 190 may include a first encapsulation inorganic layer 191, an encapsulation organic layer 192, and a second encapsulation inorganic layer 193, which are sequentially stacked.

Subsequently, the target substrate MSUB is separated from the first base substrate BSUB1 to manufacture a display device including the first base substrate BSUB1, the first barrier layer BA1, the second base substrate BSUB2, the second barrier layer BA2, the first and second buffer layers BF1 and BF2, the switching and driving transistors ST and DT, and the organic light emitting diode 180.

Hereinafter, Preparation Examples and Experimental Examples of the above-described first barrier layer including silicon oxide and a display device including the same will be described.

Preparation Example 1: Preparation 1 of Silicon Oxide Thin Film

A glass substrate was mounted in a chamber, and a silicon oxide thin film is formed to a thickness of about 6,000 Å using $N_2O$ gas and $SiH_4$ gas under the conditions of a power of 8,930 W, a pressure of 1,000 mTorr, and a temperature of 370° C. In this case, a number of silicon oxide thin films are formed by adjusting the ratio of $SiH_4$ gas to $N_2O$ gas to about 22 to about 60, respectively.

Experimental Example 1: Measurement of Physical Properties of Silicon Oxide Thin Film The FT-IR Si—O bonding peaks, hydrogen contents, film stresses, and dielectric constants of the silicon oxide thin films prepared in Preparation Example 1 were measured, respectively.

Figure 8:
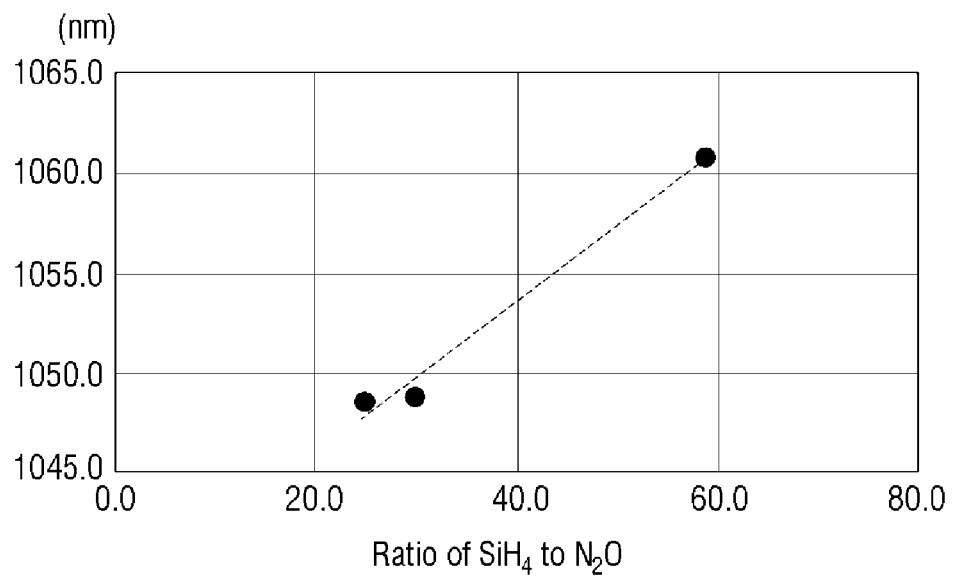
FIG. 8 is a graph illustrating the FT-IR Si—O bonding peaks of silicon oxide thin films according to Experimental Example 1.
Figure 9:
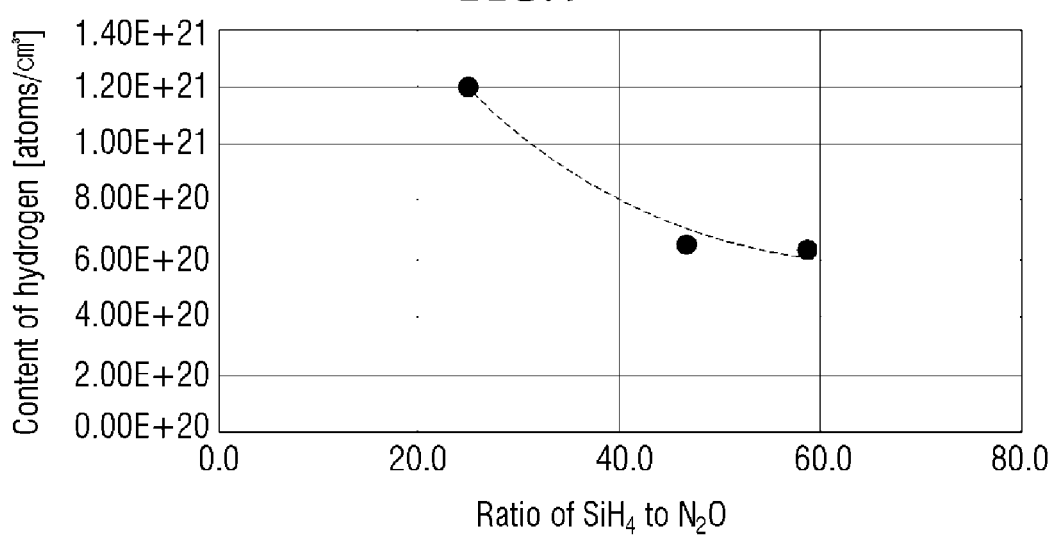
FIG. 9 is a graph illustrating the hydrogen contents of silicon oxide thin films according to Experimental Example 1.
Figure 10:
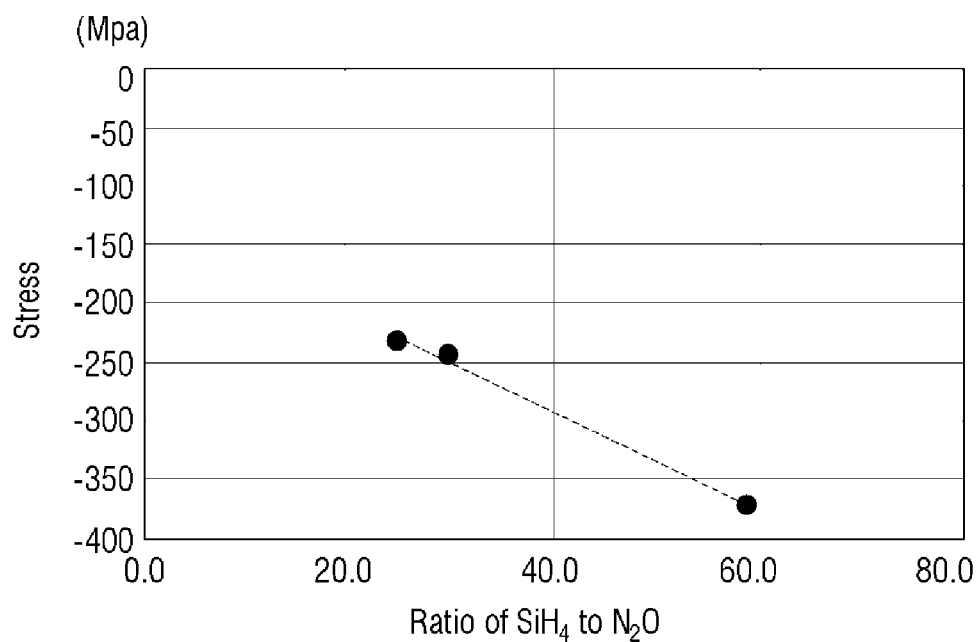
FIG. 10 is a graph illustrating the film stresses of silicon oxide thin films according to Experimental Example 1.
Figure 11:
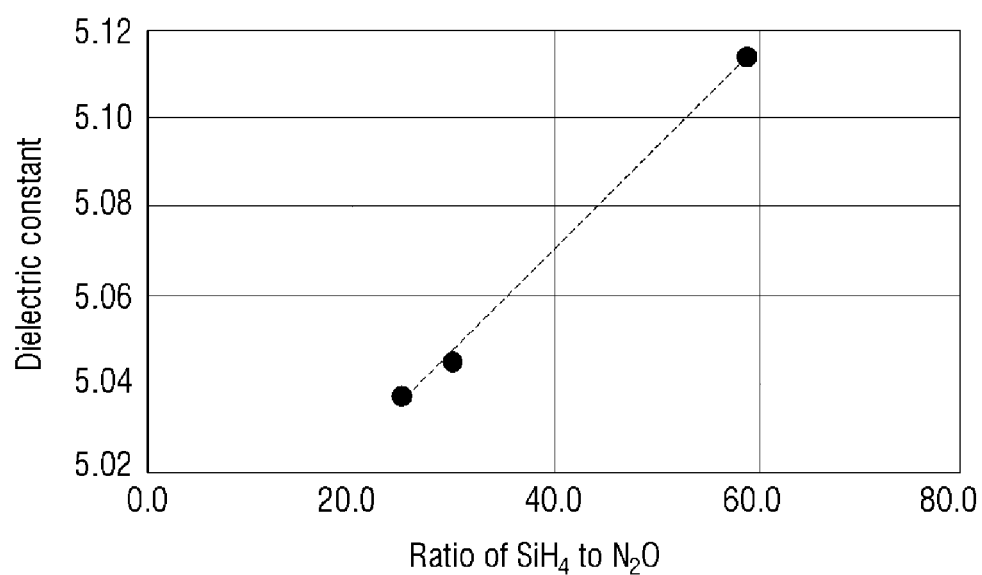
FIG. 11 is a graph illustrating the dielectric constants of silicon oxide thin films according to Experimental Example 1.

FIG. 8 is a graph illustrating the Fourier Transform-Infrared Spectroscopy (FT-IR) Si—O bonding peaks of silicon oxide thin films according to Experimental Example 1. FIG. 9 is a graph illustrating the hydrogen contents of silicon oxide thin films according to Experimental Example 1. FIG. 10 is a graph illustrating the film stresses of silicon oxide thin films according to Experimental Example 1. FIG. 11 is a graph illustrating the dielectric constants of silicon oxide thin films according to Experimental Example 1.

Referring to FIGS. 8, 9, 10, and 11, as the ratio of $SiH_4$ gas to $N_2O$ gas decreases from 60 to 22, the Si—O bonding peak value of the silicon oxide thin film decreases from about 1060 nm to about 1048 nm, the hydrogen content thereof increases from about $6.00E^{+20}$ atom/$cm^3$ to $1.20E+21$ atom/$cm^3$, the film stress thereof increases from about −370 Mpa to about −230 Mpa, and the dielectric constant thereof decreases from about 5.11 to about 5.04.

Thus, when the ratio of $SiH_4$ gas to $N_2O$ gas is about 22 or less, it may be found that the Si—O bonding peak value of the silicon oxide thin film decreases to about 1,048 nm or less, the hydrogen content thereof increases to $1.20E+21$ atom/$cm^3$ or more, the film stress thereof increases to about −230 Mpa or more, and the dielectric constant thereof decreases to about 5.04 or less.

Preparation Example 2: Preparation 2 of Silicon Oxide Thin Film

A first polyimide layer is applied onto a glass substrate, a silicon oxide thin film is formed on the first polyimide layer under the same conditions as in Preparation Example 1, and a second polyimide layer is applied on the silicon oxide thin film. In this case, thin films #1, #2, #3, #4, and #5 are prepared such that the ratios of $SiH_4$ gas to $N_2O$ gas are about 19.6, 21.2, 23.0, 24.9, and 34.3, respectively. Further, thin film #6 is prepared by additionally forming an amorphous silicon layer between the silicon oxide thin film and second polyimide layer in the thin film #3.

Figure 12:
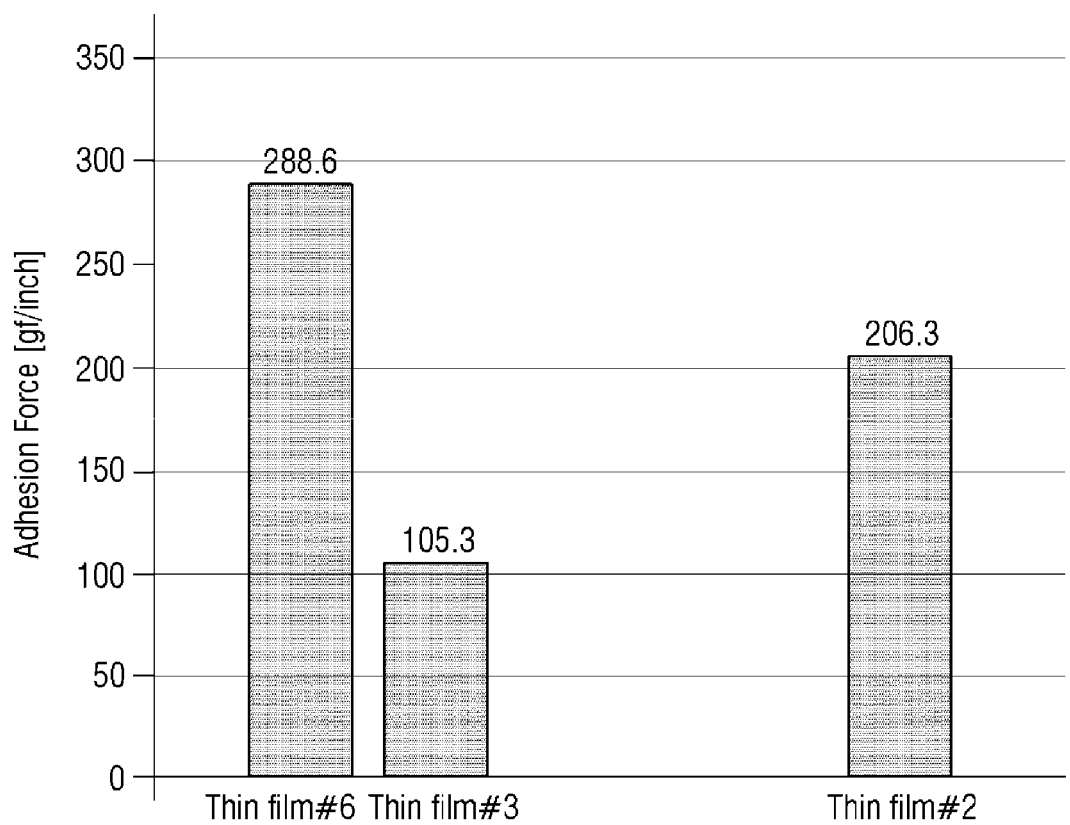
FIG. 12 is a graph illustrating the adhesion forces of silicon oxide thin films according to Experimental Example 2.

Experimental Example 2: Measurement of Adhesion Force of Silicon Oxide Thin Film to Second Polyimide Layer Adhesion forces of the thin films #1, #2, #3, #4, #5, and #6 were measured using a tensile tester (UTM) and given in Table 1 below, and adhesion forces of the thin films #2, #3, and #6 are shown in the graph of FIG. 12. FIG. 12 is a graph illustrating the adhesion forces of silicon oxide thin films according to Experimental Example 2.

TABLE 1

| Thin film | Ratio of $SiH_4$ to $N_2O$ | Adhesion force (gf/inch) |
|---|---|---|
| #1 | 19.6 | 323.8 |
| #2 | 21.2 | 206.3 |
| #3 | 23.0 | 105.3 |
| #4 | 24.9 | 102.0 |
| #5 | 34.3 | 55.0 |
| #6 | 23.0 | 288.6 |

Referring to Table 1 and FIG. 12, as the ratio of $SiH_4$ gas to $N_2O$ gas decreases, the adhesion forces of the thin films increases. In particular, when the ratio of $SiH_4$ gas to $N_2O$ gas is about 22 or less, the adhesion forces significantly increases, and adhesion forces equal to or higher than that of the case where the amorphous silicon thin film of the thin film #6 is present are exhibited.

Thus, it may be found that, as the ratio of $SiH_4$ gas to $N_2O$ decreases, the content of hydrogen in the silicon oxide thin film increases so that dipole sites and hydrogen bonding sites increase to increase the adhesion force of the silicon oxide thin film to polyimide.

Preparation Example 3

The above-described display device #1 of FIG. 4, including the thin film #6, was manufactured, and display device #2 including the thin film #2 is manufactured.

Experimental Example 3

Figure 13:
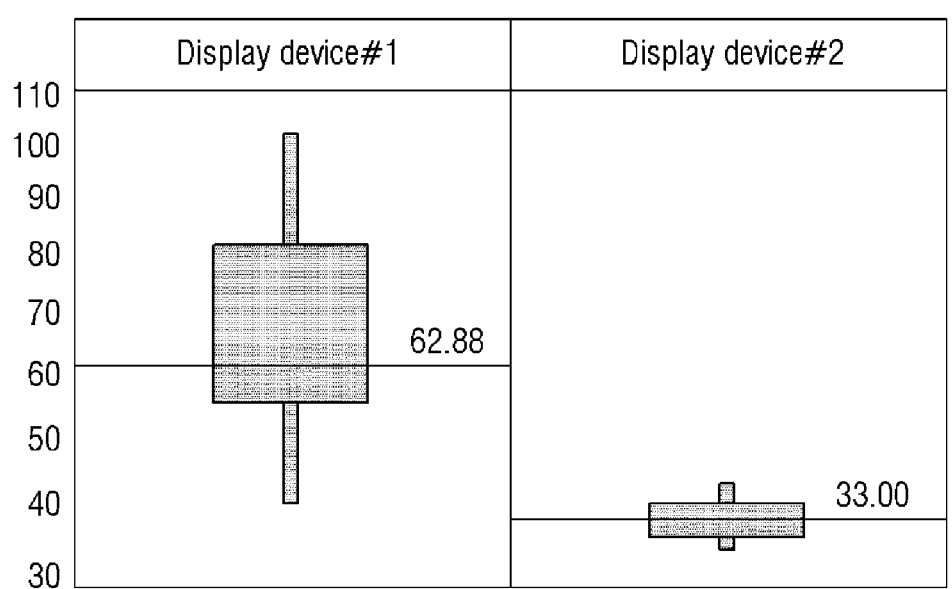
FIG. 13 is a graph illustrating the degree of afterimage of display devices #1 and #2 according to Experimental Example 3.

The display devices #1 and #2 were respectively driven to measure the degree of afterimage thereof. FIG. 13 is a graph illustrating the degree of afterimage of the display devices #1 and #2 according to Experimental Example 3.

Referring to FIG. 13, it is found that the average value of the degree of afterimage of the display device #1, and the average value of the degree of afterimage of the display device #2 decreases to about 33.00.

Thus, it may be found that, in the display device #1 including an amorphous silicon layer, at the interface between the amorphous silicon layer and the polyimide, the degree of afterimage is large due to the shift of a gate voltage caused by charge trapping, whereas in the display device #2 not including an amorphous silicon layer, at the interface between the amorphous silicon layer and the polyimide, the degree of afterimage is remarkably improved due to the reduction of charge trapping.

According to a display device and a method of manufacturing the same according to embodiments, the ratio of $SiH_4$ gas to $N_2O$ gas may be adjusted to about 22 or less when forming silicon oxide of a first barrier layer, thereby increasing the adhesion force of the silicon oxide of the first barrier layer to the polyamide of the second base substrate and the first base substrate.

Further, according to an embodiment, the first barrier layer having a dielectric constant in the range of about 4 to 6 may be formed so that the value of a capacitor generated by an electric charging at an interface between a second barrier substrate and a first barrier substrate may decrease to improve the shift of a gate voltage of a transistor, thereby reducing the optical afterimage of the display device.

The effects of the present disclosure are not limited by the foregoing, and other various effects are anticipated herein.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device, comprising:
a first base substrate;
a first barrier layer disposed on the first base substrate and including a silicon oxide having a hydrogen content between 1.20E+21 and 1.60E+21 atoms/cm$^3$;
a second base substrate disposed on the first barrier layer;
at least one transistor disposed on the second base substrate; and
an organic light emitting diode disposed on the at least one transistor,
wherein the first barrier layer is disposed between the first base substrate and second base substrate,
wherein an adhesion force between the first barrier layer and the second base substrate is between 200 gf/inch and 330 gf/inch, and SiO bonding peak of the first barrier layer is between 1045 and 1049 nm.

2. A display device, comprising:
a first base substrate;
a first barrier layer disposed on the first base substrate and including a silicon oxide;
a second base substrate disposed on the first barrier layer;
at least one transistor disposed on the second base substrate; and
an organic light emitting diode disposed on the at least one transistor,
wherein the first barrier layer is disposed between the first base substrate and second base substrate and has a dielectric constant between 5.00 and 5.05;
wherein an adhesion force between the first barrier layer and the second base substrate is between 200 gf/inch and 330 gf/inch, and
wherein the first barrier layer has a thickness greater than 5,000 Å and less than or equal to 7,000 Å.

3. The display device of claim 1, wherein the first barrier layer has a Si—O bonding peak between 1045 and 1050 nm in Fourier Transform-Infrared Spectroscopy (FT-IR) analysis.

4. The display device of claim 1, wherein the first barrier layer has a film stress between −230 MPa and −190 Mpa.

5. The display device of claim 1, wherein the first barrier layer is in direct contact with an upper surface of the first base substrate and a lower surface of the second base substrate.

6. The display device of claim 1, wherein the first base substrate and the second base substrate include polyimide.

7. The display device of claim 1, further comprising:
a second barrier layer disposed on the second base substrate; and
a buffer layer disposed on the second barrier layer.

8. A method of manufacturing a display device, the method comprising steps of:
forming a first base substrate on a support substrate;
forming a first barrier layer disposed on the first base substrate and including silicon oxide on the first base substrate using reactive gas having a ratio of $SiH_4$ gas to $N_2O$ gas from 19 to 22 and a power between 8,000 W and 10,000 W;
forming a second base substrate disposed on the first barrier layer;
forming at least one transistor disposed on the second base substrate; and
forming an organic light emitting diode disposed on the at least one transistor.

9. The method of claim 8, wherein the first barrier layer is formed at a pressure of 900 mTorr to 1,100 mTorr.

10. The method of claim 8, wherein the first barrier layer is formed at a temperature of 350° C. to 400° C.

11. The method of claim 8, further comprising:
forming a second barrier layer disposed on the second base substrate; and
forming a buffer layer disposed on the second barrier layer.

12. The method of claim 8, further comprising:
after the forming of the organic light emitting diode, forming an encapsulation layer including a first encapsulation inorganic layer, an encapsulation organic layer, and a second encapsulation inorganic layer disposed on the organic light emitting diode.

13. The method of claim 8, further comprising:
after the forming of the organic light emitting diode, removing the support substrate from the first base substrate.

14. The method of claim 8, wherein the first barrier layer has an adhesion force between 200 gf/inch and 335 gf/inch to the second base substrate.

15. The method of claim 8, wherein the first barrier layer has a hydrogen content between 1.20E+21 and 1.60E+21 atoms/cm$^3$ atoms/cm$^3$.

* * * * *